United States Patent [19]

Kim

[11] Patent Number: 5,296,741

[45] Date of Patent: Mar. 22, 1994

[54] CARRIER FOR SEMICONDUCTOR ELEMENT PACKAGES

[75] Inventor: Dae S. Kim, Kyungsangbook, Rep. of Korea

[73] Assignee: Goldstar Electron Co., Ltd., Choongchungbook, Rep. of Korea

[21] Appl. No.: 95,045

[22] Filed: Jul. 22, 1993

Related U.S. Application Data

[63] Continuation of Ser. No. 813,625, Dec. 26, 1991, abandoned.

[30] Foreign Application Priority Data

Jul. 13, 1991 [KR] Rep. of Korea ............... 10831/1991

[51] Int. Cl.$^5$ .................... H01L 23/16; H01L 23/02; H01L 23/12
[52] U.S. Cl. ........................... 257/723; 257/724
[58] Field of Search ............... 357/80, 74, 68; 174/52.4; 361/393, 394, 399, 413, 390, 391; 206/333, 328, 334; 257/685, 686, 723, 724, 726, 727

[56] References Cited

U.S. PATENT DOCUMENTS

| | | | |
|---|---|---|---|
| 4,193,656 | 3/1980 | Ward | 439/152 |
| 4,560,216 | 12/1985 | Egawa | 439/152 |
| 4,750,890 | 6/1988 | Dube et al. | 439/152 |
| 5,070,389 | 12/1991 | Nonyuki | 357/74 |
| 5,131,535 | 7/1992 | O'Connor et al. | 206/332 |

*Primary Examiner*—Sheila V. Clark
*Attorney, Agent, or Firm*—Lowe, Price, LeBlanc & Becker

[57] ABSTRACT

A carrier for semiconductor element packages comprising a carrier body having at least one series of laterally aligned chambers for receiving the packages and device for taking out the packages of the chambers. The device for taking out the packages of the chambers comprises a pushing member mounted to the carrier body to move laterally and slidably and provided with a sliding bar and a plurality of spaced projections formed on the sliding bar. Each projection has at one side of upper part thereof a slant surface which functions to raise inclinedly each package. Therefore, the carrier is capable of easily taking out the packages of the carrier and facilitating handling of the packages.

2 Claims, 3 Drawing Sheets

CARRIER FOR SEMICONDUCTOR ELEMENT PACKAGES

This application is a continuation of application Ser. No. 07/813,625 filed Dec. 26, 1991, now abandoned.

BACKGROUND OF THE INVENTION

1. Field of the Invention

The present invention relates to a carrier for storing semiconductor element packages therein and for facilitating transportation and handling of the stored semiconductor element packages therein, and more particularly to a carrier for semiconductor element packages which is provided with a device for taking out the semiconductor packages of the carrier.

2. Description of the Prior Art

Referring to FIGS. 1 and 2, there is illustrated an example of conventional carrier for semiconductor element packages (PLCC type). As shown in the drawings, the carrier comprises a carrier body 1 which is provided with a plurality of lateral partitions 2 and longitudinal partitions 3 so that a plurality of chambers 4 for receiving semiconductor element packages 10 are defined by the two kinds of partitions 2 and 3. The carrier makes the storage, the transportation and the handling of semiconductor element packages easy.

Semiconductor element packages received in the above type of carrier may be conveniently taken out of the carrier and handled, by using an automatic handler having vacuum grippers. Where the carrier is manually handled, however, each of semiconductor element packages received in the carrier should be taken out by the vacuum grippers and then manually assembled on a socket. Otherwise, each of semiconductor element packages should be taken out of the carrier, by pushing out it through a throughout hole formed at the bottom of each chamber of the carrier and then manually assembled on a socket. Such manual operation causes handling and assembling operation of semiconductor packages in carrier to be troublesome and thus processing time to increase.

SUMMARY OF THE INVENTION

Therefore, an object of the invention is to provide a carrier for semiconductor element packages which has a device for conveniently taking out semiconductor element packages of receiving chambers.

In order to achieve the above object, the carrier for semiconductor element packages according to the present invention comprises a carrier body having at least one series of laterally aligned chambers for receiving the packages, and a device for taking out the packages of the chambers.

In accordance with the present invention, the device for taking out the packages of the chambers comprises a pushing member mounted to the carrier body to move laterally and slidably and provided with a sliding bar and a plurality of spaced projections formed on the sliding bar, each of the projections having a slant surface at one side of upper part thereof, guide member formed at the carrier body and adapted to guide the sliding movement of the pushing member and elastic member adapted to return the pushing member to its original position.

BRIEF DESCRIPTION OF THE DRAWINGS

These and other objects, features and advantages of the invention will become apparent from the following detailed description taken in conjunction with the accompanying drawings, in which.

DETAILED DESCRIPTION OF THE PREFERRED EMBODIMENTS

Figure 1:
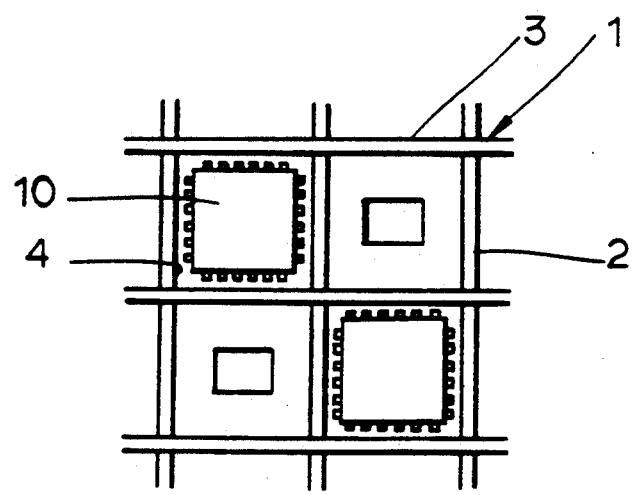
FIG. 1 is a fragmentary plan view of a carrier for semiconductor element packages of the prior art.
Figure 2:
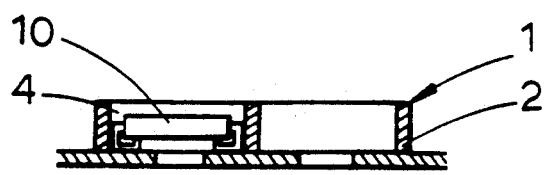
FIG. 2 is a vertical sectional view of the carrier shown in FIG. 1.
Figure 3:
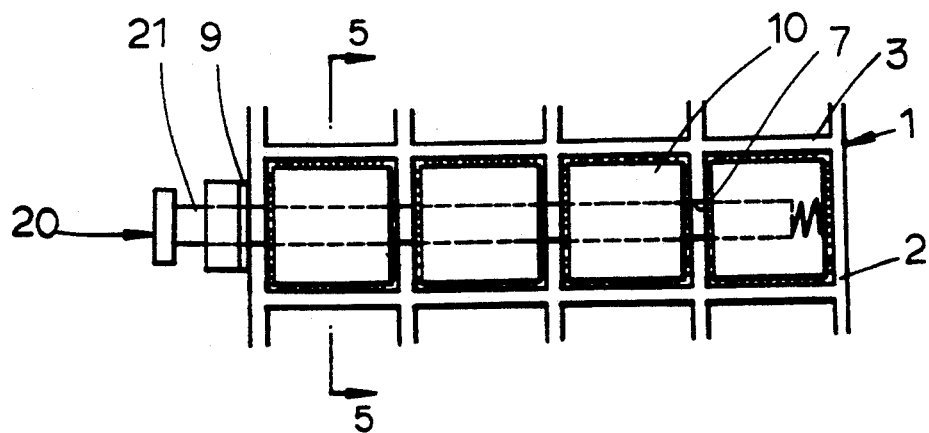
FIG. 3 is a fragmentary plan view of a carrier for semiconductor element packages according to the present invention.
Figure 4:
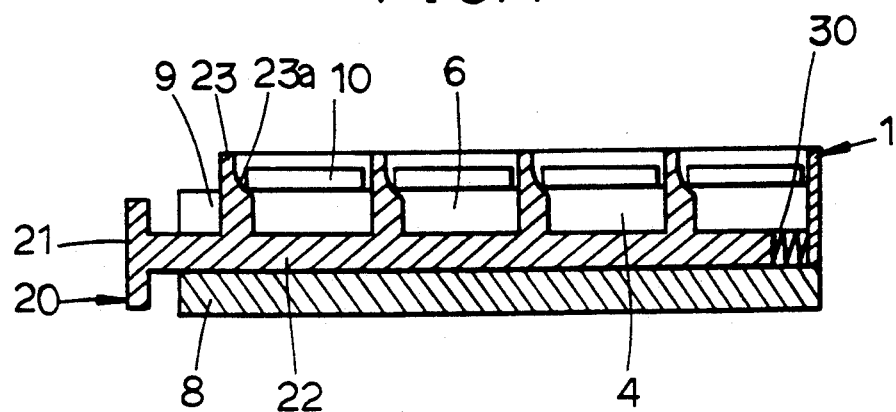
FIG. 4 is a vertical sectional view of the carrier shown in FIG. 3.
Figure 5:
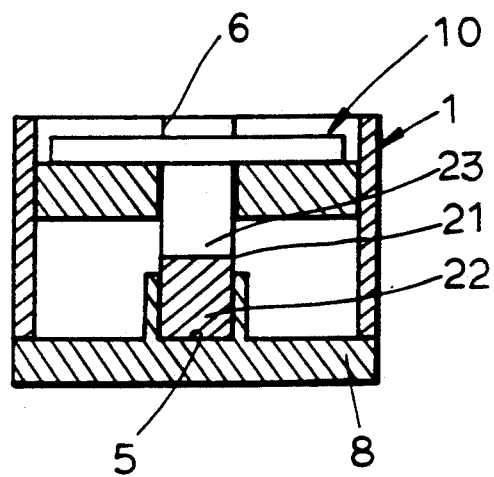
FIG. 5 is a sectional view taken on line A—A of FIG. 3.

Referring now to FIG. 3 to FIG. 6B, there is shown a carrier for semiconductor element packages according to the present invention.

The carrier comprises a carrier body 1 having a plurality of lateral partitions 3, a plurality of longitudinal partitions 2 and a base plate 8 all of which define a plurality of chambers 4 arranged in a lattice shape and adapted to receive packages 10 therein.

Particularly, in accordance with the present invention, the carrier is provided with a plurality of devices 20 for taking out semiconductor element packages 10 (but only one of the devices is illustrated in the drawings).

Also, the carrier body 1 is provided with cut-out parts 7 formed at the longitudinal partitions 2, each of the cut-out parts 7 being formed at the middle part of the longitudinal partition 2 defining one of the chambers 4, and guide channels 6 each formed at the lower part of each chamber along the center line of each series of laterally aligned chambers 4. The base plate 8 is provided with guide grooves 5 positioned below the guide channels 6. Alternately, the base plate 8 may be made separately from the carrier body 1 so that the guide grooves 5 may be provided by guide members mounted on upper surface of the base plate 8. Accordingly, the taking out devices 20 may be slidably mounted in the cut-out parts 7, the guide channels 6 and the guide grooves 5.

Each of the devices 20 for taking out semiconductor element packages 10 comprises a pushing member 21 and an elastic member such as a compression coil spring 30. The pushing member 21 comprises a sliding bar 22 having a plurality of spaced vertical projections 23 formed thereon. Each of the vertical projections 23 has a slant surface 23a formed at a right side of an upper part thereof. Each of the elastic members 30 is inserted in the protion of guide groove 5 between right end of the pushing member 2 and the longitudinal partition 2 positioned at a right end of the carrier body 1.

In the drawings, the reference numeral "9" is a stopper adapted to prevent the pushing member 21 from escaping from the carrier body 1.

The operation of the carrier according to the present invention will now be described, in conjunction with FIGS. 6a and 6b.

Figure 6A:
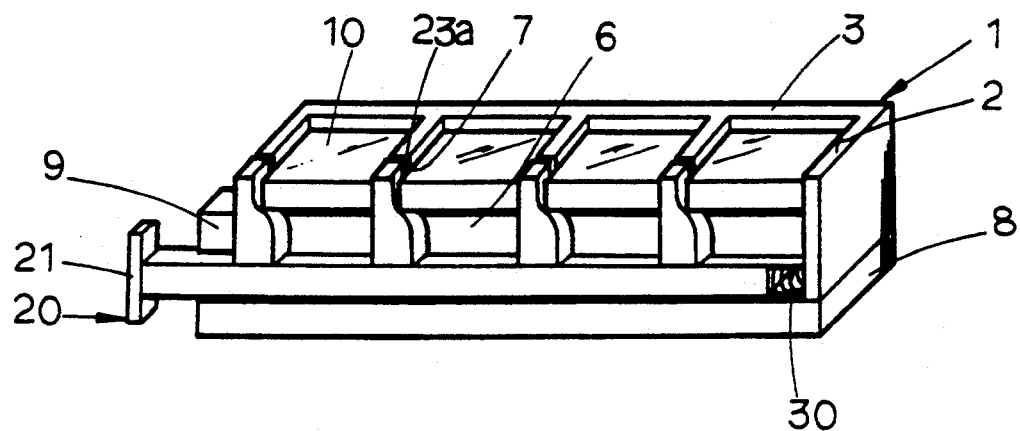
FIG. 6a is a partially sectioned perspective view of the carrier according to the present invention, showing the condition that semiconductor element packages are received in receiving chambers in position.
Figure 6B:
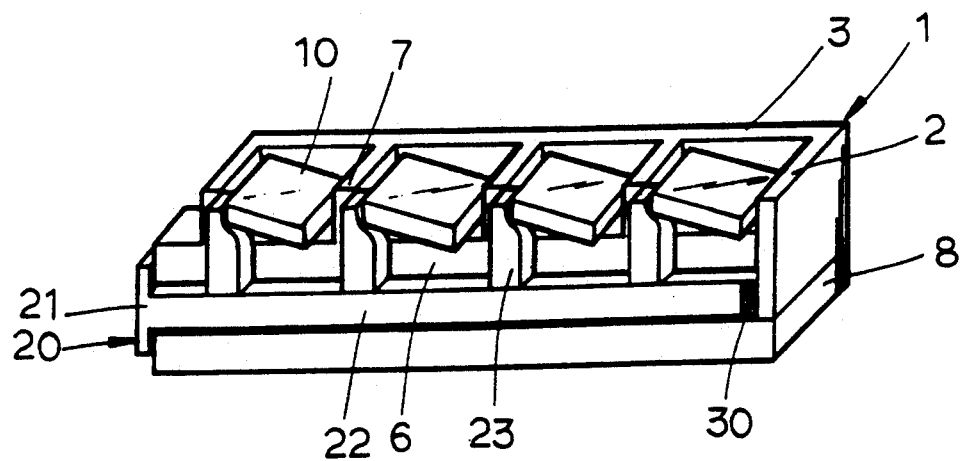
FIG. 6b is a partially sectioned perspective view of the carrier according to the present invention, showing the condition that semiconductor element packages can be taken out of the chambers.

FIG. 6a shows the condition when the semiconductor element packages 10 are firmly received in chambers 4 of the carrier. At this time, the left sides of the packages 10 are disposed on the slant surfaces 23a of the vertical projections 23, respectively. When the packages 10 are required to be taken out of the carrier, a left head portion of the pushing member 21 is manually pressed in the right direction of FIG. 6a, along the guide groove 5. By the movement of the pushing member 21, the slant surface 23a of each projection 23 moves right and pushes the contact left side of corresponding package 10 so that the package is inclinedly raised at the left side thereof by a further movement of the projections 23 in the right direction. Accordingly, the user may easily take out the raised packages 10 of the carrier.

Thereafter, as the user releases the force applied to the pushing member 21, the pushing member 21 returns to its original position by the resilience of the compression spring 30. At this time, the returning movement of the pushing member 21 is limited to a predetermined range, by the stopper 9 which is mounted across each of the guide channels 6 and adjacent to an outer surface of the left end projection 23.

As described hereinbefore, the carrier for semiconductor element packages according to the present invention allows packages received therein to be easily taken out of the carrier only by the taking out devices, without using a vacuum gripper, thereby facilitating handling of packages during manufacturing process.

It is further understood by those skilled in the art that the foregoing description is a preferred embodiment of the disclosed carrier and that various changes and modifications may be made in the invention without departing from the spirit and scope thereof.

What is claimed is:

1. A carrier for semiconductor element packages comprising:

a carrier body having at least one series of laterally aligned chambers for receiving the packages; and means for positioning the packages for being removed from the chambers, said means for positioning being disposed in said carrier body and including means for inclining the packages;

wherein each of said means for positioning comprises:

a pushing member mounted to said carrier body to move the packages laterally and slidably along a horizontal direction and provided with a sliding bar extended in the horizontal direction and a plurality of spaced vertical projections formed on the sliding bar, each of the projections having a slant surface at one side of upper part thereof adapted to incline the packages for removal when the pushing member is moved;

guide means formed at the carrier body and adapted to guide the sliding movement of said pushing member; and elastic means adapted to return the pushing member to its original position and inserted between an end of said pushing member and said carrier body.

2. The carrier according to claim 1, wherein said elastic means comprises a spring.

* * * * *